(12) United States Patent
Fairbairn et al.

(10) Patent No.: US 8,349,196 B2
(45) Date of Patent: Jan. 8, 2013

(54) SYSTEM AND METHOD FOR COMMERCIAL FABRICATION OF PATTERNED MEDIA

(75) Inventors: Kevin P. Fairbairn, Los Gatos, CA (US); Michael S. Barnes, San Ramon, CA (US); Terry Bluck, Santa Clara, CA (US); Ren Xu, San Jose, CA (US); Charles Liu, Los Altos, CA (US); Ralph Kerns, San Carlos, CA (US)

(73) Assignee: Intevac, Inc., Santa Clara, CA (US)

( * ) Notice: Subject to any disclaimer, the term of this patent is extended or adjusted under 35 U.S.C. 154(b) by 879 days.

(21) Appl. No.: 12/329,462

(22) Filed: Dec. 5, 2008

(65) Prior Publication Data
US 2009/0145879 A1 Jun. 11, 2009

Related U.S. Application Data

(60) Provisional application No. 61/052,131, filed on May 9, 2008, provisional application No. 60/992,972, filed on Dec. 6, 2007.

(51) Int. Cl.
*B44C 1/22* (2006.01)
(52) U.S. Cl. .............................. 216/22; 216/37; 216/39
(58) Field of Classification Search .................... 216/22, 216/37, 39
See application file for complete search history.

(56) References Cited

U.S. PATENT DOCUMENTS

| | | |
|---|---|---|
| 3,968,018 A | 7/1976 | Lane et al. |
| 4,261,808 A | 4/1981 | Walter |
| 4,351,714 A | 9/1982 | Kuriyama |
| 4,482,419 A | 11/1984 | Tsukada et al. |
| 5,244,554 A | 9/1993 | Yamagata et al. |
| 5,286,296 A | 2/1994 | Sato et al. |
| 5,296,091 A | 3/1994 | Bartha et al. |
| 5,425,611 A | 6/1995 | Hughes et al. |

(Continued)

FOREIGN PATENT DOCUMENTS
EP 0811704 B1 12/1997
(Continued)

OTHER PUBLICATIONS

International Search Report for PCT Application No. PCT/US08/85728 dated Feb. 19, 2009.

(Continued)

*Primary Examiner* — Binh X Tran
(74) *Attorney, Agent, or Firm* — Nixon Peabody LLP; Joseph Bach, Esq.

(57) ABSTRACT

A system is provided for etching patterned media disks for hard drive. The modular system may be tailored to perform specific processes sequences so that a patterned media disk is fabricated without removing the disk from vacuum environment. In some sequence the magnetic stack is etched while in other the etch is performed prior to forming the magnetic stack. In a further sequence ion implantation is used without etching steps. For etching a movable non-contact electrode is utilized to perform sputter etch. The cathode moves to near contact distance to, but not contacting, the substrate so as to couple RF energy to the disk. The substrate is held vertically in a carrier and both sides are etched serially. That is, one side is etched in one chamber and then in the next chamber the second side is etched.

14 Claims, 11 Drawing Sheets

U.S. PATENT DOCUMENTS

| | | | |
|---|---|---|---|
| 5,651,867 | A | 7/1997 | Kokaku et al. |
| 5,772,905 | A | 6/1998 | Chou |
| 5,846,328 | A | 12/1998 | Aruga et al. |
| 6,027,618 | A | 2/2000 | Aruga et al. |
| 6,101,972 | A | 8/2000 | Bluck et al. |
| 6,251,232 | B1 | 6/2001 | Aruga et al. |
| 6,334,960 | B1 | 1/2002 | Willson et al. |
| 6,440,520 | B1 | 8/2002 | Baglin et al. |
| 6,482,742 | B1 | 11/2002 | Chou |
| 6,635,115 | B1 | 10/2003 | Fairbairn et al. |
| 6,669,811 | B2 | 12/2003 | Hao et al. |
| 6,699,332 | B1 | 3/2004 | Piramanayagam et al. |
| 6,762,766 | B1 | 7/2004 | Nakayama |
| 6,770,896 | B2 | 8/2004 | Schriever |
| 6,872,467 | B2 | 3/2005 | Qian et al. |
| 7,026,098 | B2 | 4/2006 | Komatsu et al. |
| 7,027,156 | B2 | 4/2006 | Watts et al. |
| 7,041,394 | B2 | 5/2006 | Weller et al. |
| 7,147,790 | B2 | 12/2006 | Wachenschwanz et al. |
| 7,314,833 | B2 | 1/2008 | Kamata et al. |
| 2002/0086240 | A1 | 7/2002 | Petersson et al. |
| 2002/0127623 | A1 | 9/2002 | Minshull et al. |
| 2004/0096581 | A1 | 5/2004 | Yashiro et al. |
| 2005/0170215 | A1 | 8/2005 | Liu et al. |
| 2005/0224344 | A1 | 10/2005 | Iwasaki et al. |
| 2005/0271819 | A1* | 12/2005 | Wago et al. ............ 427/259 |
| 2006/0102078 | A1 | 5/2006 | Fairbairn et al. |
| 2006/0142890 | A1* | 6/2006 | Edo ..................... 700/112 |
| 2006/0157201 | A1 | 7/2006 | Hoffman et al. |
| 2006/0236932 | A1 | 10/2006 | Yokogawa et al. |
| 2006/0269796 | A1* | 11/2006 | Hyodo .................. 428/833.2 |
| 2007/0012660 | A1 | 1/2007 | Lewington et al. |
| 2007/0209590 | A1 | 9/2007 | Li |
| 2007/0230055 | A1* | 10/2007 | Shirotori et al. ........... 360/135 |
| 2007/0275569 | A1 | 11/2007 | Moghadam et al. |
| 2008/0062547 | A1 | 3/2008 | Bandic et al. |
| 2008/0075979 | A1* | 3/2008 | Inamura et al. ........... 428/828 |
| 2008/0085362 | A1* | 4/2008 | Yen et al. ............... 427/128 |
| 2009/0145752 | A1 | 6/2009 | Barnes et al. |
| 2009/0145881 | A1 | 6/2009 | Barnes et al. |
| 2010/0059476 | A1* | 3/2010 | Yamamoto et al. .......... 216/22 |
| 2012/0090992 | A1 | 4/2012 | Fairbairn et al. |

FOREIGN PATENT DOCUMENTS

| | | |
|---|---|---|
| EP | 1727134 A1 | 11/2006 |
| WO | WO 03/081633 A2 | 10/2003 |

OTHER PUBLICATIONS

International Search Report for PCT Application No. PCT/US08/85749 dated Feb. 2, 2009.

International Search Report for PCT Application No. PCT/US08/85750 dated Feb. 2, 2009.

Yao Fu, "Design of a Hybrid Magnetic and Piezoelectric Polymer Microactuator," PhD Thesis, Swinburne University of Technology, Australia. Published Dec. 2005.

Office Action in U.S. Appl. No. 13/338,182, mailed May 24, 2012.

Office Action in U.S. Appl. No. 12/329,447, mailed Aug. 24, 2011.

Office Action in U.S. Appl. No. 12/329,447, mailed Jan. 13, 2012.

Office Action in U.S. Appl. No. 12/329,447, mailed Aug. 15, 2012.

Office Action in U.S. Appl. No. 12/329,457, mailed Sep. 2, 2011.

Office Action in U.S. Appl. No. 12/329,457, mailed Jan. 18, 2012.

Examination Report in Singapore Patent Application No. 201003293-6, dated Jan. 16, 2012.

Examination Report in Singapore Patent Application No. 201003413-0, dated Nov. 23, 2011.

Written Opinion in Singapore Patent Application No. 201003293-6, mailed May 31, 2011.

Written Opinion in Singapore Patent Application No. 201003805-7, mailed Jun. 15, 2011.

Office Action in Chinese Application No. 200880118973.8, dated Nov. 9, 2011.

Office Action in Chinese Application No. 200880119457.7, dated Dec. 7, 2011.

Office Action in Chinese Application No. 200880119425.7, dated Oct. 17, 2011.

Office Action in Chinese Application No. 200880119425.7, dated Jul. 4, 2012.

Zhu, J.G., "New Heights for Hard Disk Drives," Materials Today, Elsevier, Jul./Aug. 2003, pp. 22-31.

"Preparation of Hard Disk Drive Magnetic Recording Media for XTEM Analysis," Application Laboratory Report 11, South Bay Technology Inc., May 2007, 3 pages.

"Perpendicular Magnetic Recording Technology," White Paper, Hitachi Global Storage Technologies, Nov. 2007, 4 pages.

Bandic, Z. et al., "Patterned Magnetic Media: Impact of Nanoscale Patterning on Hard Disk Drives," Solid State Technology; accessed from http://www.solid-state.com on Jul. 28, 2008, 4 pages.

Kanellos, M. "A Divide Over the Future of Hard Drives," Cnet News, published Aug. 23, 2006, accessed from http://news.cnet.com on Jun. 12, 2008, 3 pages.

Lammers, D. "MII Tackles Patterned Media Opportunity," Semiconductor International, accessed from http://www. semiconductor.net on Jun. 12, 2008, 5 pages.

Sbiaa, R. et al., "Patterned Media Towards Nano-bit Magnetic Recording. Fabrication and Challenges," Recent Patents on Nanotechnology, vol. 1, 2007, pp. 29-40.

"Conventional Media vs. Patterned Media," Hitachi Global Storage Technologies, accessed from http://www.hitachigst.com on Jun. 12, 2008, 1 page.

* cited by examiner

| 1 | 2 | 3 | 4 | 5 | 6 | 7 | 8 |
|---|---|---|---|---|---|---|---|
| De-scum Trim | SnO2 HM | Resist Strip | Mag Layer Etch Side I | Cooling | Mag Layer Etch Side I | Cooling | Mag Layer Etch Side II |
| RF | RF | RF | Sputter Etch | DCS : Dynamic Cooling | Sputter Etch | DCS : Dynamic Cooling | Sputter Etch |
| 16 | 15 | 14 | 13 | 12 | 11 | 10 | 9 |
| Flash Carbon | DLC | C/M (or SiO2) Etch | C or M Refill (or SiO2) | C/M (or SiO2) Etch | C or M Refill (or SiO2) | SnO2 Reductive Strip | Mag Layer Etch Side II |
| URMA | NCT | Soft Etch (or Sp Ech) | URMA (or RF) | Soft Etch (or Sp Ech) | URMA (or RF) | RF | Sputter Etch |

SYSTEM AND METHOD FOR COMMERCIAL FABRICATION OF PATTERNED MEDIA

RELATED APPLICATIONS

This Application claims priority from U.S. Provisional Application Ser. No. 61/052,131, filed May 9, 2008, and from U.S. Provisional Application Ser. No. 60/992,972, filed Dec. 6, 2007, the disclosure of both of which is incorporated herein in its entirety.

This application also relates to U.S. application Ser. No. 12/329,447, and U.S. application Ser. 12/329,457, both filed on Dec. 5, 2008.

BACKGROUND

1. Field of the Invention

This invention relates to the art of substrates, e.g., disk, micro-fabrication and, more particularly, to patterning of substrates, e.g., the magnetic layers of a hard disk for hard disk drives.

2. Related Arts

Micro-fabrication of substrates is a well know art employed in, for example, fabrication of semiconductors, flat panel displays, light emitting diodes (LED's), hard disks for hard disk drives (HDD), etc. As is well known, fabrication of semiconductors, flat panel displays and LED's involves various steps for patterning the substrate. On the other hand, traditional fabrication of hard disks, generally referred to as longitudinal recording technology, does not involve patterning. Similarly, fabrication of disks for perpendicular recording technology does not involve patterning. Rather uniform layers are deposited and memory cells are generally defined by the alternating change of magnetic flux induced by the recording head, with each recording bit encompassing multiple grains within the un-patterned magnetic layers.

It has been demonstrated that non-patterned disks would fail to satisfy the needs of the market, in terms of area bit density and costs, in order to remain competitive with other forms of storage. Consequently, it has been proposed that next generation disks should be patterned. It is envisioned that the patterning process may utilize photolithography, although currently there is no certainty which lithography technology may be commercialized, and no commercial system is yet available for commercial manufacturing of patterned media. Among contenders for photolithography are interference photolithography, near field lithography and nano-imprint lithography (NIL). Regardless of the lithography technology utilized, once the photoresist is exposed and developed, the disk needs to be etched and fabricated according to the desired pattern. However, to date much of the development efforts has been focused on the patterning step and no technology has been proposed for fabricating a patterned disk in a commercially viable environment.

To be sure, etch, sputtering, and other fabrication technologies are well known and well developed for semiconductor, flat panel display, LED's, etc. However, no system has been proposed for integrating these technology to enable fabrication of disks for HDD. Moreover, unlike HDD disks, in all of these applications only one side of the substrate needs to be etched—allowing a chuck to hold the substrate from the backside during fabrication. On the other hand, HDD disks need to be fabricated on both sides, preventing the use of a chuck. Indeed, in HDD disk fabrication no part of the fabrication system may contact any surface of the disk. Also, while HDD manufactures expect the system to have a throughput on the order of 1000 disks per hour, fabricators of semiconductors employ systems having throughputs of only tens of substrates per hour.

In view of the above, a method and system are required to enable fabrication of hard disks to provide patterned media for HDD.

SUMMARY

The following summary is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Methods and systems are provided for integrated fabrication of disks to be used in HDD in a commercially viable manner. Various processing steps are outlined and their sequence is designed to result in a functional patterned media disk. The system may be constructed by modifying a commercial processing system, such as the 200 Lean® available from Intevac, of Santa Clara, Calif.

As noted above, the fabrication of patterned media requires, among others, incorporating etching technology to the disk fabrication. In considering the application of plasma etching technology to hard disks, the subject inventors have recognized that standard plasma etching technology is problematic for etching patterned hard disks. Unlike semiconductors and other applications, the disks need to be etched on both sides. Therefore, conventional systems having plasma etch on only one side are not workable for hard disks. Also, since both sides of the disks are fabricated, no element of the fabrication machine can be allowed to touch either surface of the disk. Therefore, prior art systems utilizing conventional chucks cannot be used for processing hard disks, as they touch the backside. This raises another problem in that, if no chuck can be used to hold the disk, how can a bias potential be applied to cause species of the plasma to impinge on the surface of the disk?

The subject inventors have provided solutions to the above problems and developed a patterned media fabrication system that is commercially viable. The fabrication system includes an etching system and method that enable etching of both sides of the disks, without touching any surface of the disk. Embodiments of the invention also enable applying bias potential to cause the plasma species to impinge the surface of the disk without attaching the disk to a chuck.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 11A is a partial isometric view shown the movable cathode in a position away from the disk, while

DETAILED DESCRIPTION

General Process

Figure 1:
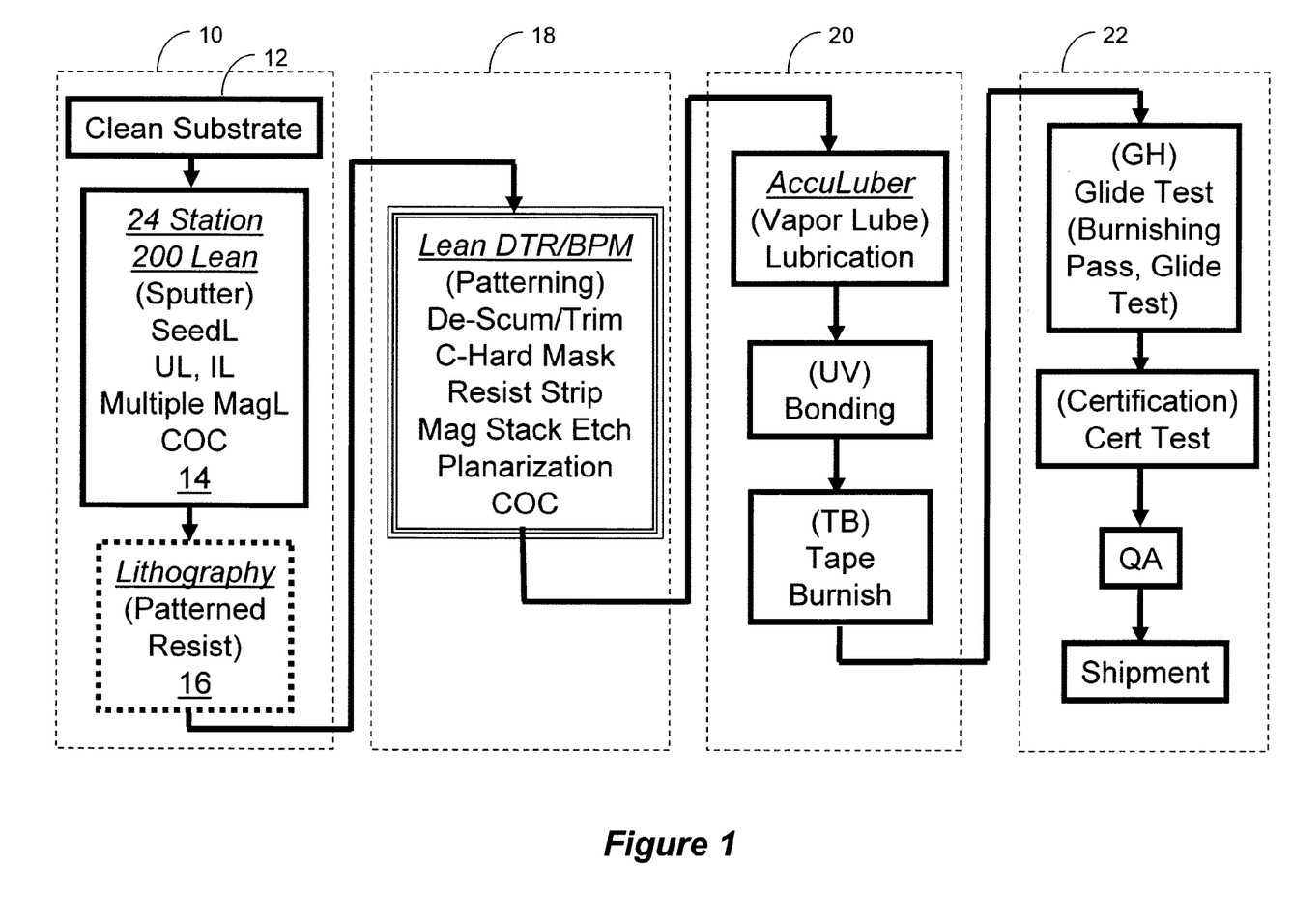
FIG. 1 illustrates a flow chart of a complete process for fabricating HDD patterned media disks according to one generic embodiment of the invention.

According to embodiments of the invention, system and methods are provided for fabricating patterned media disks. FIG. 1 illustrates a flow chart of a complete process for fabricating HDD patterned media disks, generally divided into four modules (indicated by light broken-line boxes). In FIG. 1 solid-line box indicates utilization of conventional continuous media fabrication equipment, broken-line box indicates utilization of lithography equipment, such as, e.g., nano-imprint lithography, and double-line box indicates utilization of novel patterned media fabrication equipment. In module 10 fabrication starts by cleaning the disks in a cleaning apparatus 12. The disks are then moved to a conventional processing system 14, such as the 200 Lean® for fabricating non-patterned magnetic layers. Thereafter, the disks are moved to a lithography module 16 to imprint the patterning. The lithography module may be any of the technologies currently under consideration, including, but not limited to, nano-imprint lithography. Generally, in the lithography module the disk is coated with a photoresist, the photoresist is "exposed" to the required pattern (either by radiation or physical contact with a master, i.e., imprinted), then the exposed resist is developed, or cured under UV irradiation. Once the lithography processing is completed, the disk is transferred to the patterning system 18.

In the patterning system 18 various processing are performed, which may include de-scum, resist trim, hard mask deposition and etch, resist strip, metal etching, planarization (which may include carbon or metal or oxide refill and etchback). These processes are performed in a plurality of chambers, each having an independent vacuum environment; however, once the disk enters system 18 it never leaves the vacuum environment until processing is completed. The details about these processes and the various system elements used to perform them will be described below. Once processing in the patterning system 18 is completed, the disks are moved to modules 20 and 22, which are not relevant to the subject disclosure.

Figure 2:
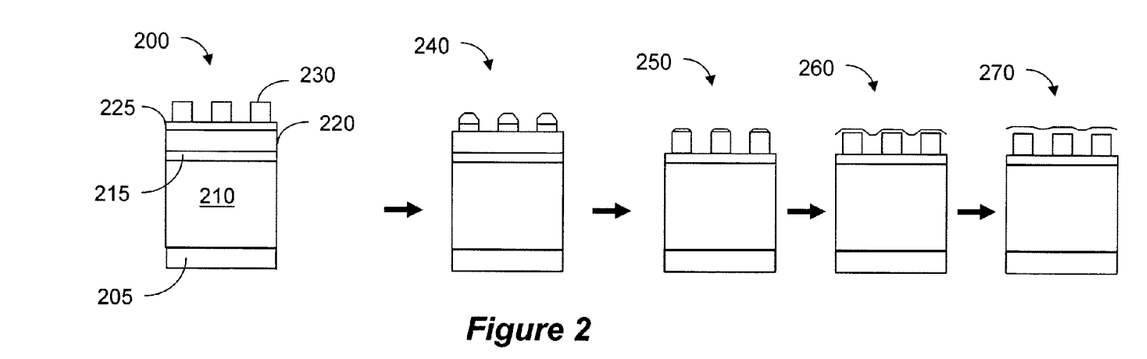
FIG. 2 illustrates a cross section of a patterned media undergoing a general process flow according to one generic embodiment of the invention.

FIG. 2 illustrates cross section of a patterned media undergoing a general process flow according to an embodiment of the invention. The disk arrives at the patterning system having the structure illustrated as 200. The structure includes the substrate 205 upon which a soft underlayer (SUL) 210 is deposited. The SUL layer is a "soft" or relatively low-coercivity magnetically permeable underlayer that serves as a flux return path for the field from the write pole to the return pole of the recording head. A seed layer 215 is formed over the SUL, 210 and the magnetic layer 220 is formed over the seed layer. To protect the magnetic layer on disk from mechanical wear by the flying head and environmental chemical corrosion, a thin protective coat of diamond type carbon (carbon overcoat, COC) layer 225 is applied over the magnetic layer 220. Then a patterning mask 230 is formed using, e.g., photoresist or other masking material in a nano-imprinting step. The structure shown as 200 then undergoes processing in the patterning system, as generally shown by structures 240, 250, 260 and 270.

In 240 the COC layer has been etched so as to be used as a hard mask. That is, once the COC layer has been etched, the photoresist may be removed and the COC layer would maintain the desired pattern. Then at 250 the magnetic layer is etched using the COC layer as the hard mask. Each of these two etch steps may be performed as sequential steps, i.e., etching one side of the disk at a time. This would be explained more completely below. In 260 a carbon refill layer is deposited to fill the patterned magnetic layer, and then the carbon refill layer is etched back to form a relatively flat top surface. At 170 a thin protective coat of diamond-like carbon layer (generally referred to as NCT carbon) is formed.

General System Architecture

Figure 3:
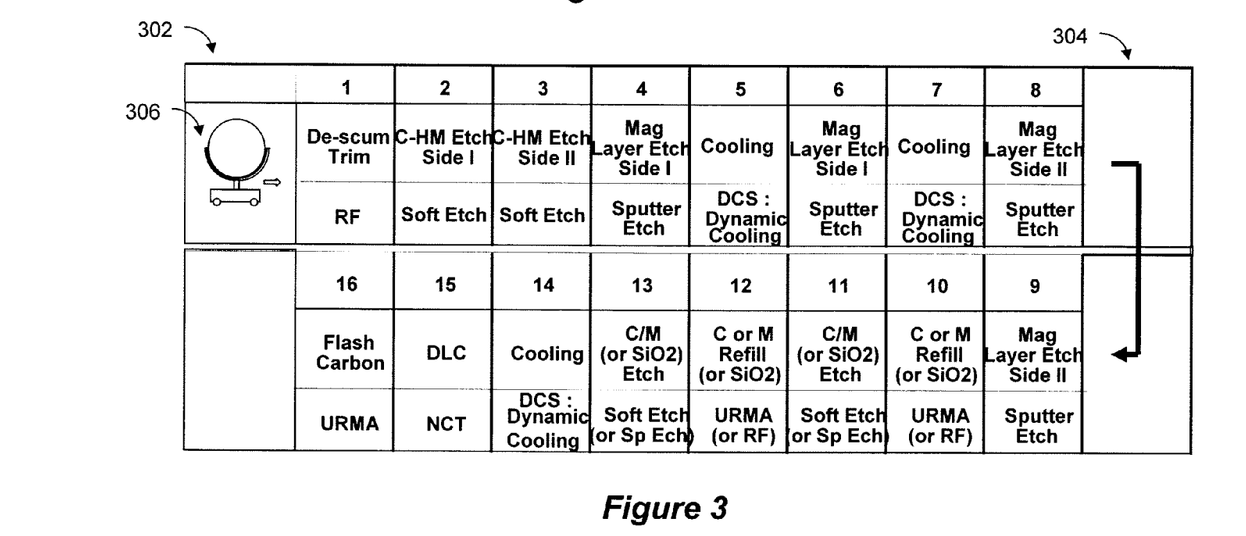
FIG. 3 illustrates an example of a patterning system according to an embodiment of the invention.

FIG. 3 illustrates an example of a patterning system according to an embodiment of the invention. The general structure of the system may mimic that of the 200 Lean® available from Intevac, of Santa Clara, Calif. In this example the system has two elevators, 302 and 304, and sixteen processing chambers, labeled 1-16. In the system, each chamber has a lower part that functions as transport chamber for transporting the carrier with the disk, generally 306, and an upper processing chamber for performing the process on the disk. While some chambers process both sides of the disk simultaneously, others process only one side, and so are provided in pairs to complete processing on both sides of the disk.

In the example of FIG. 3, chamber 1 is a de-scum chamber, which may also be used for trimming the photoresist. Note that when the process involved hard mask patterning, this step may be skipped, provided that the photo-resist is of a desired shape and gross dimension, as the hard mask patterning would remove any excess photo-resist. This chamber processes both sides of the disk simultaneously. Chambers 2 and 3 are utilized for carbon hard mask etch, i.e., for etching the COC layer. In the example of FIG. 3 the etch process may be done by oxidation assisted soft etch using, e.g., biased RF source or remote plasma using, e.g., oxygen gas. In this example a biased RF plasma is used, so that each of chambers 2 and 3 etches one side of the disk. This can be accomplished with the close-proximity-bias backing plate mechanism used in the stations 4, 6, 8 and 9. If a non-biased plasma is used, e.g., remote plasma source, the process may be performed in a single chamber, etching both sides simultaneously. In general, for this step selectivity of the etch is the natural selectivity ratio that exist between photoresist and carbon, which can be between 1:1 to up to 1:10, depending on the carbon type and the resist type. Total etch thickness may be about 10-1000A, depending on the magnetic layer thickness and the etch selectivity. For the examples shown herein, the end point of the COC etch may be critical so as to avoid oxygen poisoning of the magnetic layer. Therefore, in one embodiment, towards the end of the hard mask-oxidation assisted etch-process, oxygen flow is stopped, so that the process continues with oxygen free plasma. In another embodiment, the oxidative reactant used for the carbon hard mask etch, maybe that of a reduced (mitigated) oxidation-power reagent, that effectively stops at the metal surface and allows for differentiation of the two process step.

Since in most applications the thickness of the photoresist would exceed that of the COC layer, it is likely that some photoresist would remain after completing the COC etch. Therefore, a step of reductive strip of resist may also be performed in chambers 2 and 3, or in subsequent chambers (not shown). This may be also performed using soft plasma using H2/O2 source gas. Since this process may also use oxygen, it is critical to avoid oxygen poisoning of the magnetic layer. This may be done by timely stopping flow of oxygen or by forming a passivation layer (e.g., Pt, Ta, Cr) over the magnetic layer before performing the strip resist step.

Chambers 4-9 are used to alternatingly etch the magnetic layer on one side of the disk and cool the disk after an etch process. In this example, no cooling chamber is provided between chambers 8 and 9, as in this example cooling between these two etch processes is done in elevator 304. Of course, if necessary, another cooling chamber may be added between these two chambers. In this example the magnetic layer is etched using ion beam etch (IBE), which requires biasing the disk. Therefore, each chamber is structured to etch only one side of the disk. If a reactive ion etch (RIE) is used, each chamber may be configured to etch both sides simultaneously. The magnetic layer etch is performed using an innovative etch chamber that will be described in details in the section under the heading Etch Chamber.

The magnetic layer etch process should be designed so as to avoid puncturing the carbon hard mask, so here selectivity is more important. Total etch depth of this step is about 100-1000A. It is desired to leave some thickness of the COC layer on top of the un-etched islands, which also helps preventing damage to the magnetic layer.

Chamber 10 is used for forming a carbon refill layer to fill the etched regions. This may be done by sputtering carbon, e.g., NCT or sputtered carbon, filling with SiO2, or other materials. The thickness of the refill should be sufficient to allow follow-on planarization. In the example of FIG. 3 the refill is performed in two stages (chambers 10 and 12), with two follow-on planarization steps (chamber 11 and 13). Of course, depending on the refill material and technology used for the refill and planarization, other arrangements and different number of chambers may be utilized. Planarization may be done using etch back, e.g., using soft etch. The refill-etch back processing is followed with a cooling chamber 14.

Chambers 15 and 16 are used to form a hard protective layer over the planarized refill. An additional benefit of the carbon refill is to effectively passivate the side-wall of the etched magnetic features. This is critical for the magnetic integrity of the critical feature of a patterned media. The side-wall coverage and passivation of the patterned medial side-walls, can be accomplished by the NCT stations that are field-deployed in the HDD industry with zero-bias, effecting a chemical vapor deposition environment for isotropic carbon deposition and side-wall coverage and passivation as needed for the patterned media.

Alternative Processes and System Architectures

Figure 4:
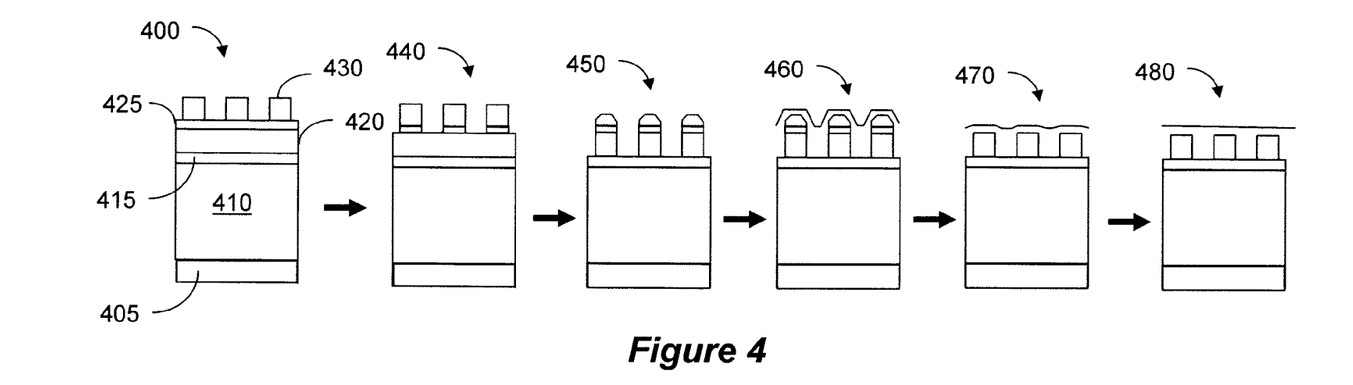
FIG. 4 illustrates another process for fabricating a patterned media disk according to an embodiment of the invention.
Figure 5:
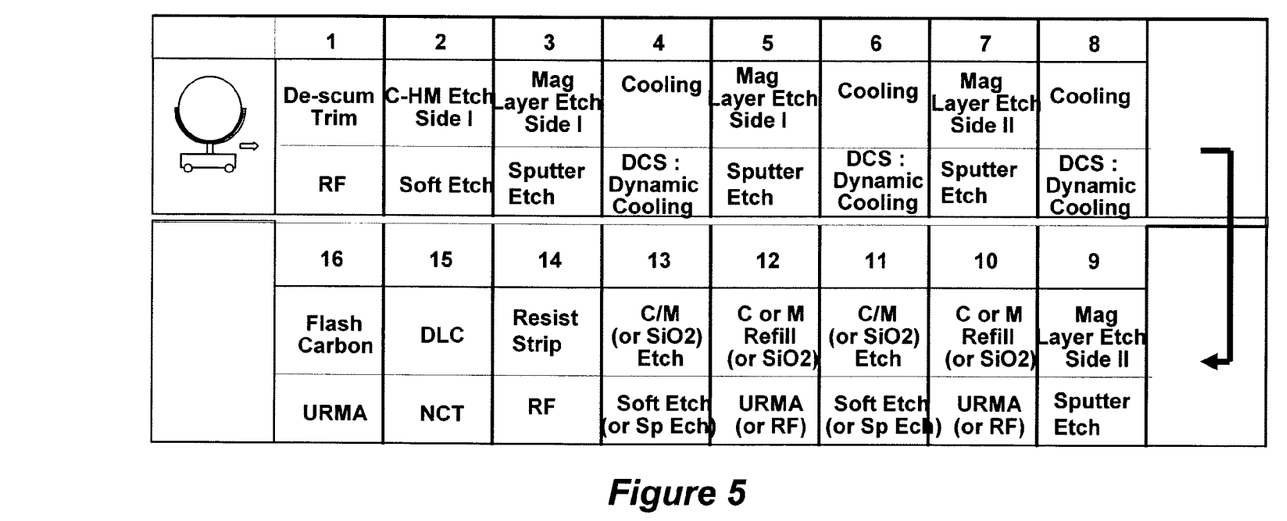
FIG. 5 illustrates a general architecture of a system tailored for executing the process of FIG. 4.

FIG. 4 illustrates another process for fabricating a patterned media disk, starting from a photo-resist-patterned disk 400 that is the same as 200 in FIG. 2. FIG. 5 illustrates a general architecture of a system tailored for executing the process of FIG. 4. With respect to step 440, after a de-scum/trim step in chamber 1, the disk is moved to chamber 2 for etching the thin COC and thereby create a hard mask with some photo-resist possibly still remaining on top of the COC layer. In step 450 the magnetic layer is etched. In this example, the magnetic layer etch step is performed sequentially with interlacing cooling steps. This is shown in FIG. 5, wherein the disk undergoes RIE (Reactive Ion Etch) etch on one side in chamber 3, is cooled in chamber 4, undergoes further etch on the same side with a following cooling step. Then the process repeats for the opposite side. In this example some photo-resist still remains after the completion of the magnetic layer etch step on both sides of the disk. Thereafter, in step 460 a carbon refill step is performed, followed by etch back. This step may be repeated in chambers 12 and 3. Then the carbon refill is etched back so as to expose and strip the remaining photo-resist (step 470). Finally, a carbon protective layer is formed over the disk in chambers 15 and 16.

Figure 6:
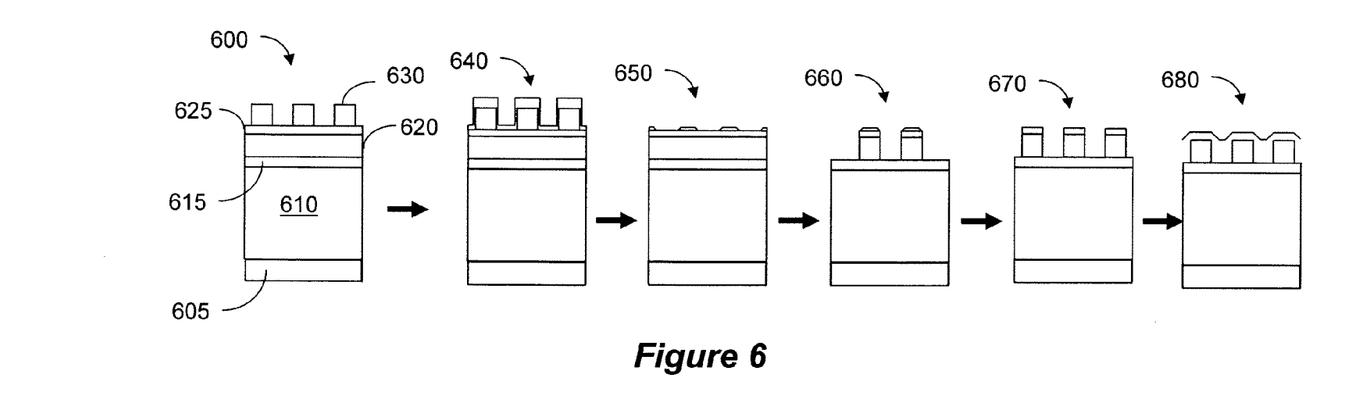
FIG. 6 illustrates another process for fabricating a patterned media disk, according to an embodiment of the invention.
Figure 7:
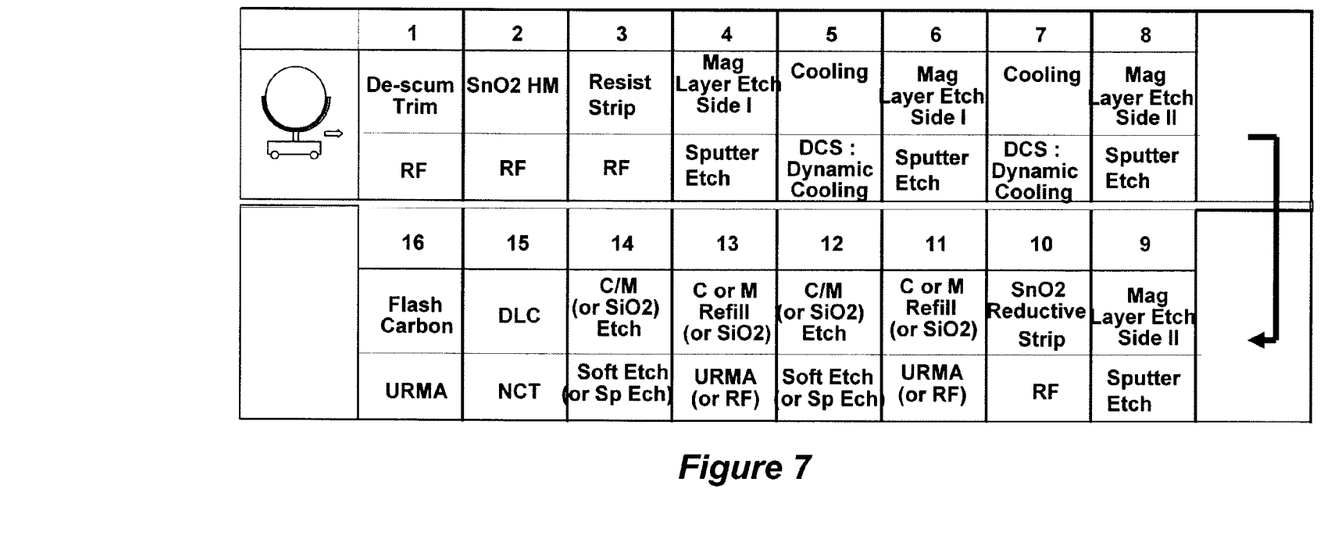
FIG. 7 illustrates a general architecture of a system tailored for executing the process of FIG. 6.

FIG. 6 illustrates another process for fabricating a patterned media disk, starting from a photo-resist-patterned disk 600 that is the same as 200 in FIG. 2. FIG. 7 illustrates a general architecture of a system tailored for executing the process of FIG. 6. After a de-scum/trim step in chamber 1, a hard mask layer, e.g., a SnO2 or carbon hard mask, is deposited over the photo-resist in step 640. This step may be performed using sputtering process in chamber 2. Then the photo-resist is striped in chamber 3, so that only the SnO2 hard mask remains—step 650. The hard mask is then used to etch the magnetic layer using alternating etch and cooling chambers 4-9 (step 660). When the magnetic layer etch steps have been competed, the SnO2 hard mask may optionally be removed in chamber 10 using, e.g., hydrogen gas. Alternatively, chamber 10 may be a cooling chamber and instead of removing the hard mask, alternating steps of carbon refill and etch back are performed over the hard mask, with the last etch back used to planarize the surface of the disk and remove the SnO2 hard mask. Then a protective coating is formed over both sides of the disk in chambers 15 and 16.

Etch Chamber

In the examples of fabricating patterned media disks discussed so far an etch step is required to etch the magnetic layer. In the following, a novel movable non-contact electrode is described for performing sputter etch which is particularly beneficial for sputtering of hard disks used in hard disk drives (HDD). The electrode moves to near contact distance to, but not contacting, the substrate so as to couple RF energy to the disk. The material to be etched may be metal, e.g., Co/Pt/Cr or similar metals. No surface contact is allowed by any part of the system. The substrate is held vertically in a carrier and both sides must be etched. In one embodiment, one side is etched in one chamber and then the second side is etched in the next chamber. An isolation valve is disposed between the two chambers and the disk carrier moves the disks between the chambers. The carrier may be a linear drive carrier, using, e.g., magnetized wheels and linear motors.

In one embodiment the chamber has a showerhead on one side and a movable electrode on the other side. The showerhead may be grounded or biased, and has provisions for delivering gas into the chamber, e.g., argon, and/or reactive gases, such as CxFy, $Cl_2$, $Br_2$, etc. The chamber also has guides or rails for the linear drive disk carrier. When the disk carrier assumes processing position, the electrode is moved close to the disk, but not touching it. An RF power, e.g., 13.56 MHz is coupled to the electrode, which is capacitively coupled to the disk. A plasma is then ignited in the void between the disk and the showerhead, to thereby sputter material from the face of the disk. In the next chamber, the exact arrangement is provided, except in the opposite facing order, so that the opposing face of the disk is etched. A cooling chamber may be interposed between the two chambers, or after the two chambers.

Figure 8:
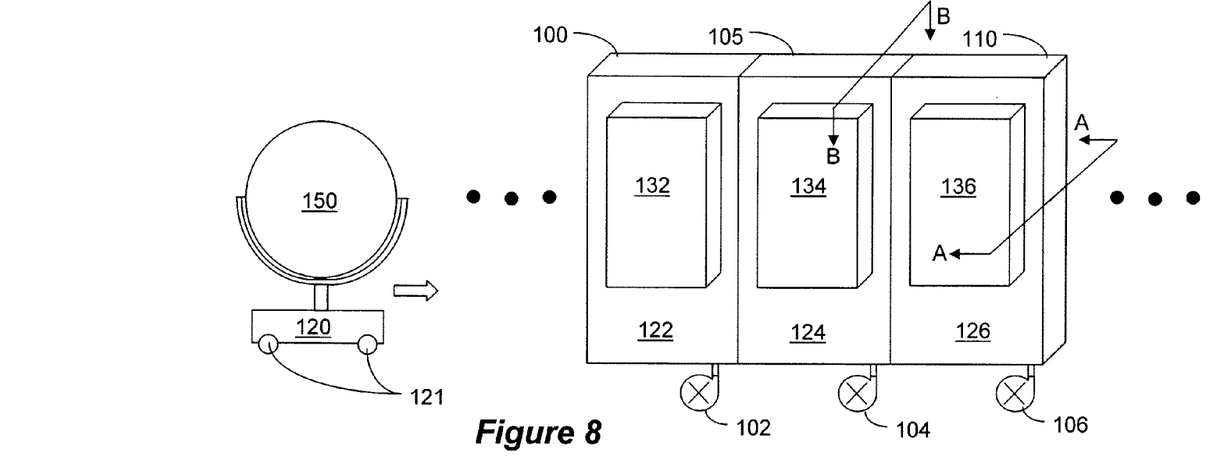
FIG. 8 illustrates part of a system for fabricating a patterned hard disk according to an embodiment of the invention.

An embodiment of the inventive etch chamber will now be described with reference to the drawings. FIG. 8 illustrates part of a system for fabricating a patterned hard disk according to an embodiment of the invention, e.g., part of the system illustrated in any of FIG. 3, 5, or 7. In FIG. 8, three processing chambers, 100, 105 and 110, are shown, but the three dots on each side indicates that any number of chambers may be used. Also, while here three specific chambers are shown, it is not necessary that the chamber arrangement shown here would be employed. Rather, other chamber arrangements may be used and other type of chambers may be interposed between the chambers as shown.

For illustration purposes, in the example of FIG. 8 the three chambers 100, 105 and 110 are etch chambers, each evacuated by its own vacuum pump 102, 104, 106. Each of the processing chambers has a transfer section, 122, 124 and 126, and a processing section 132, 134 and 136. Disk 150 is mounted onto a disk carrier 120. In this embodiment the disk is held by its periphery, i.e., without touching any of its surfaces, as both surfaces are fabricated so as to pattern both sides. The disk carrier 120 has a set of wheels 121 that ride on tracks (not shown in FIG. 8). In one embodiment, the wheels are magnetized so as to provide better traction and stability. The disk carrier 120 rides on rails provided in the transfer sections so as to position the disk in the processing section. In one embodiment, motive force is provided externally to the disk carrier 120 using linear motor arrangement (not shown in FIG. 8).

Figure 9:
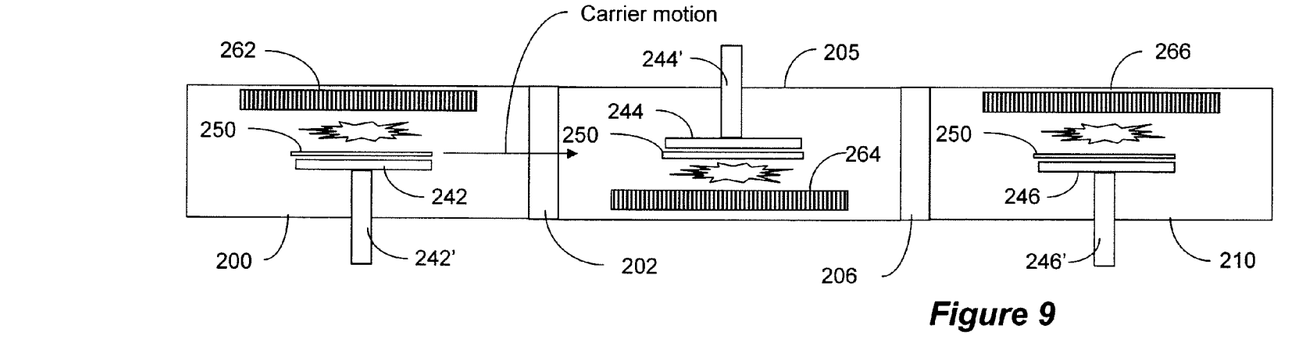
FIG. 9 illustrates a cross section along lines A-A in FIG. 8.

FIG. 9 illustrates a cross section along lines A-A in FIG. 8. For simplicity, in FIG. 9 disk 250 is illustrated without its carrier, but it should be appreciated that the disk remains on the disk carrier throughout the processing performed in the system of FIG. 8, and is transported from chamber to chamber by the disk carrier, as illustrated by the arrow in FIG. 9. In this illustrative embodiment, in each chamber, 200, 205 and 210, the disk is fabricated on one side. As shown in FIG. 9, as the disk moves from chamber to chamber the disk is fabricated on alternating sides, however it should be appreciated that the order of surface fabrication may be changed. Also shown in FIG. 9 are isolation valves 202 206 that isolate each chamber during fabrication. Each chamber includes a movable electrode (in this example a cathode) 242, 244, 246, mounted onto a movable support 242', 244', 246', and a precursor gas delivery apparatus 262, 264, 266, such as a shower head.

Figure 10:
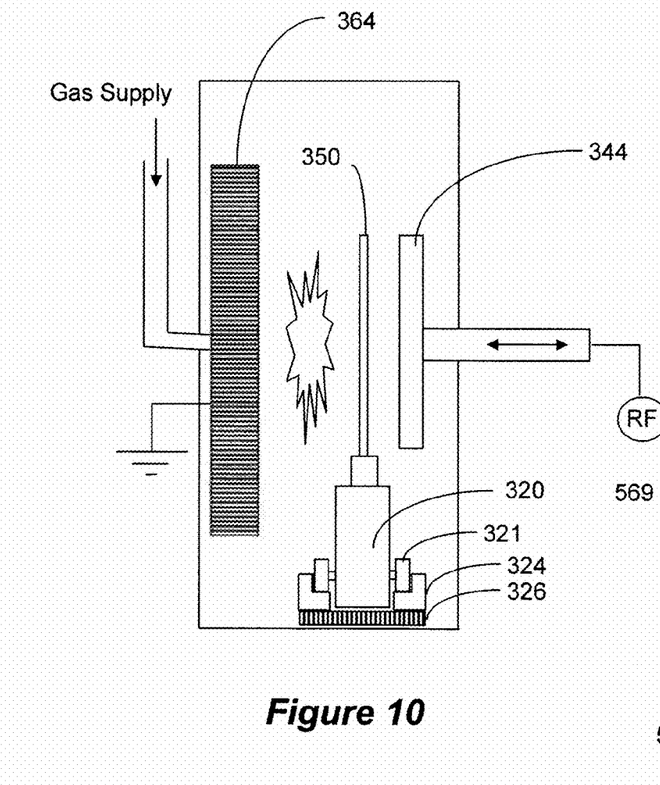
FIG. 10 illustrates a cross section along lines B-B in FIG. 8.

FIG. 10 illustrates a cross section along lines B-B in FIG. 8. Disk 350 is shown mounted onto carrier 320. Carrier 320 has wheels 321, which ride on tracks 324. The wheels 321 may be magnetic, in which case the tracks 324 may be made of paramagnetic material. In this embodiment the carrier is moved by linear motor 326, although other motive forces and/or arrangements may be used. Once the chamber is evacuated, precursor gas is supplied into the chamber via, e.g., shower head 364. The shower head may be grounded. Plasma is ignited and maintained by applying RF bias energy to the movable cathode 344. While other means for igniting and maintaining the plasma may be utilized, movable cathode provides the bias energy necessary to attract the plasma species and accelerate them towards the disk so as to sputter material from the disk. That is, when the movable cathode 344 is moved very close to one surface of the disk, it capacitively couples the RF bias energy to the disk, so that plasma species are accelerated towards the disk so as to etch the opposite surface. It should be appreciated that while FIG. 8 is explained with respect to a movable cathode 344, the same effect can be achieved by using a moving anode, as will be explained with respect to FIG. 16.

Figure 11A:
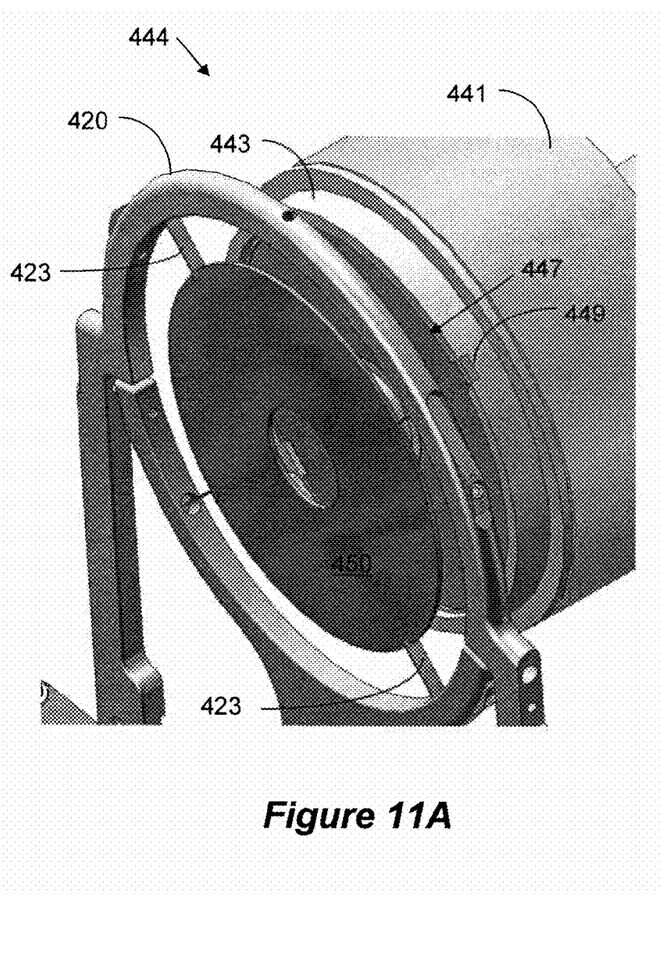
Figure 11B:
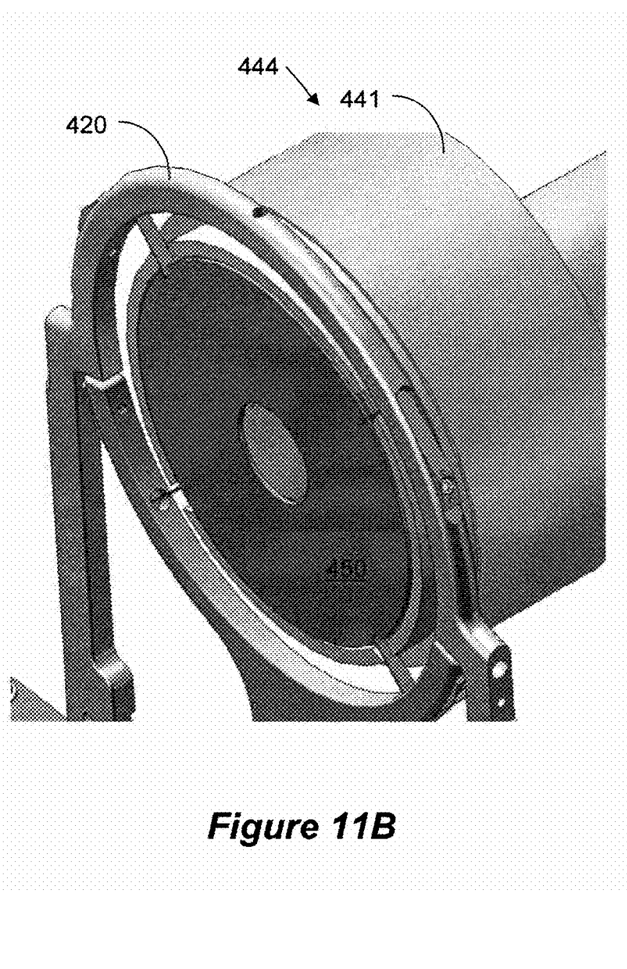
FIG. 11B is a partial isometric view showing the movable cathode in a position proximate the disk.

FIG. 11A is a partial isometric view shown the movable electrode in a position away from the disk, while FIG. 11B is a partial isometric view showing the movable electrode in a position proximal to the disk. FIG. 11A illustrates the situation when the disk is just inserted into the chamber or is about to leave the chamber, and no processing is performed. FIG. 11B illustrates the situation of the chamber during processing, i.e., during etching of the disk. Disk 450 is held by its periphery by clips 423 of carrier 420 (four clips are utilized in this example). The movable electrode assembly 444 includes the electrode housing 441, electrode cover 443, and electrode 447. In this example, electrode cover 443 has notches 449 that match the clips 423, so that in its proximal position, shown in FIG. 11B, the cover does not touch the clips. Also, while a bit obscured, the electrode itself is in a doughnut shape, matching the shape of the disk, i.e., having a center hole matching the center hole of the disk.

Figure 12:
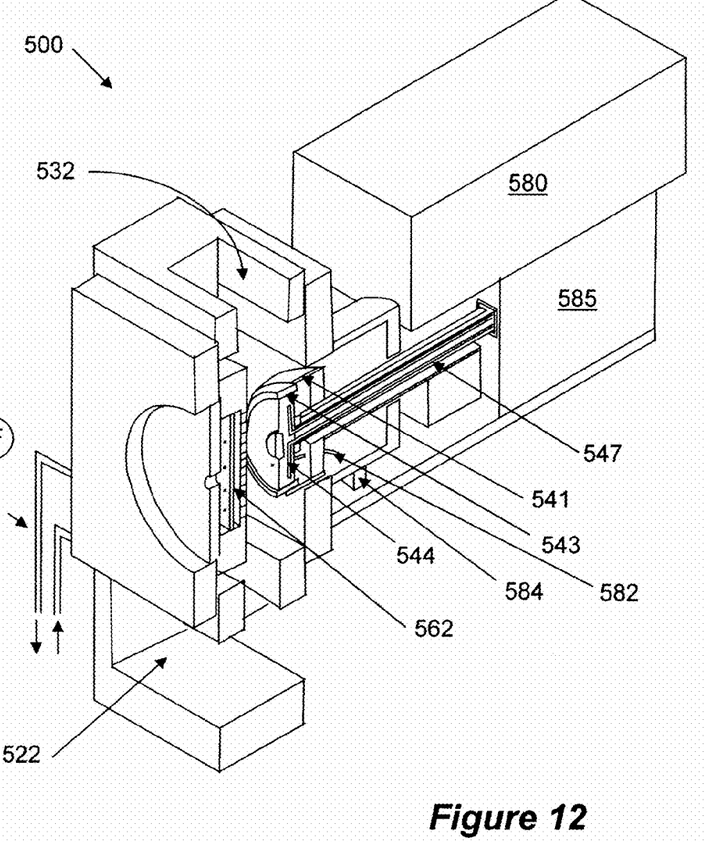
FIG. 12 illustrates a disk etch chamber according to an embodiment of the invention.

FIG. 12 illustrates an etch chamber according to an embodiment of the invention. In FIG. 12 some elements were cut and some removed in order to expose elements that are relevant to understanding the embodiment. The entire assembly is mounted on a main chamber body 500, having lower part 522 serving as transport chamber for carrier transport and upper part 532 dedicated for disk fabrication, i.e., etch. In this figure, the tracks and linear motor that normally reside in transport chamber 522 have been removed to provide a clearer view. Precursor gas delivery is done from one side of the main chamber body 500, while RF energy coupling is provided from the other side. In this embodiment precursor gas is delivered into the chamber using a showerhead assembly 562. RF energy coupling is accomplished using a movable electrode assembly that comes very close to, but does not touch the disk. The electrode assembly is moved using motion assembly 585 so as to be in a retracted mode during disk motion and in an extended mode during etching (see FIGS. 11A and 11B).

RF energy coupling is done capacitively from a conductive electrode to the disk and thence to the plasma. The electrode assembly comprises an electrode 544 made of conductive material and shaped to complement the surface of the disk. An electrode cover 543 is provided about the electrode, and extends beyond the electrode 544 so that when the electrode is in its proximal, energized position, the electrode cover 543 covers the edges of the disk. In this position the electrode cover 543 prevents plasma species from attacking the sides of the disk and prevents plasma from reaching the backside surface of the disk, i.e., prevents plasma from escaping the space between the surface facing the electrode and the electrode.

For non-reactive etch, the precursor gas may be, for example, argon. Since the magnetic metals generally utilized for magnetic disks may be physically etched, i.e., by sputtering, argon is a suitable precursor gas. During processing the chamber may be maintained at reduced pressure, e.g., 10-80 millitorr (mT), although certain processes may be performed at pressures of 1 mT to 10 torr. The RF energy may be set to, e.g., 100-3000 watts, at frequency of, e.g., 13.56 MHz. In the example of FIG. 5 the construction is made compact by coupling the RF match 580 to the etch chamber. RF power from the match 580 is coupled to the conductive electrode 544. In one embodiment, fluid pipes 547 provide fluid as a heat exchange medium to cool or heat the electrode 544. Similarly, fluid pipes 569 may provide heat exchange fluid to the showerhead.

In order to effectively couple the RF energy to the disk, the electrode 544 must be place very close to the disk. In the embodiments illustrated the distance between the disk and the electrode may be set to between 0.02" to 0.75". In these examples the placement may be done to an accuracy of ±0.005". In one example, the placement accuracy is enabled by using a proximity sensor, such as, e.g., one or more optical sensors. As shown in FIG. 12, fiber optic 582 provides optical path from the electrode 544 to an optical sensor 584. A plurality of fiber optics and corresponding sensors may be used and various optical techniques may be utilized to enhance placement accuracy and prevent collision with the disk.

In one example, both the electrode and the showerhead are made of hard anodized aluminum. Notably, unlike conventional etch chambers, here the conductive surface of the electrode is exposed and is not covered with an insulator. As in other examples, the showerhead is grounded and is fixed, i.e., not movable. Insulating parts may be made of alumina (where exposure to plasma may occur) or Ultem. With the embodiments as described, etch rates higher than 10 nm per second may be achieved.

Figure 13:
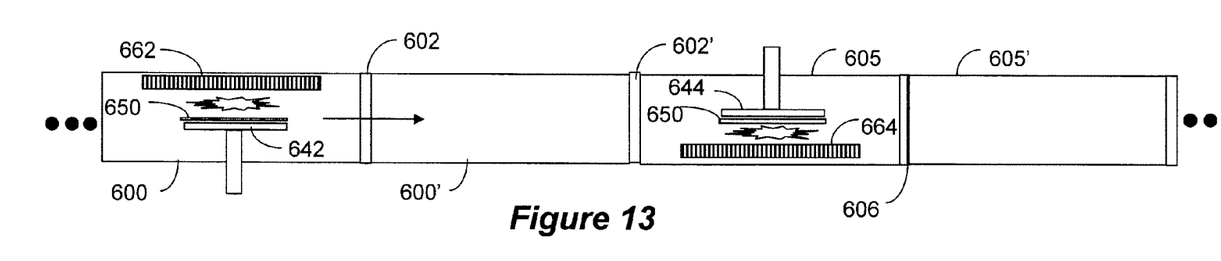
FIG. 13 illustrates an embodiment of a system having alternating etch chambers and cooling stations.

FIG. 13 illustrates an embodiment of a system having alternating etch chambers and cooling stations. As indicated by the three dotes on each side, the arrangement may repeat itself or be coupled to other chambers performing other processes or to cooling or transfer chambers. Notably, chamber 600 is positioned to etch one surface of the disk 650. The isolation valve 602 is then opened and the disk is moved to cooling chamber 600'. At the next round valve 602' is opened and the disk is moved into etch chamber 605. Etch chamber 605 is positioned to etch the opposite side of the disk. Thereafter the disk is moved to another cooling station 605'.

Figure 14:
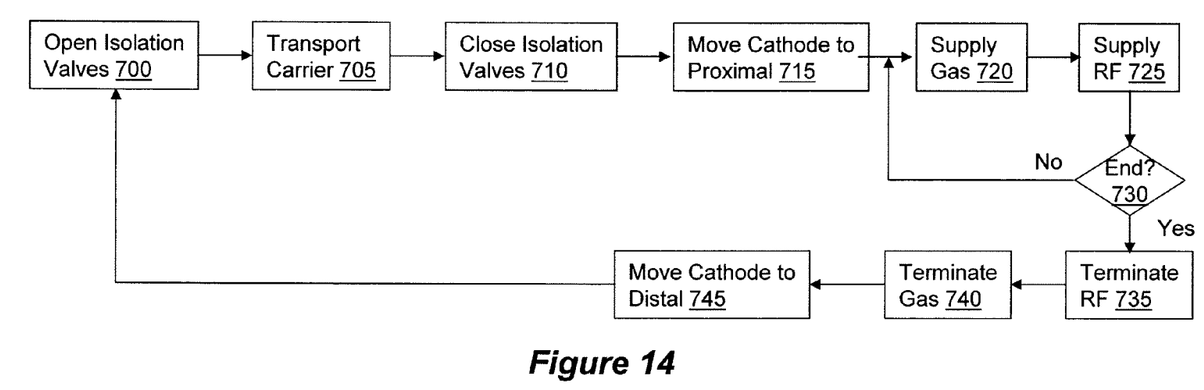
FIG. 14 illustrate a flow of a process according to an embodiment of the invention.

FIG. 14 illustrate a flow of a process according to an embodiment of the invention. At step 700 the isolation valves are open and at step 705 the carrier is transported so as to place the substrate in the proper position for processing. At step 710 the isolation vales are closed and at step 715 the electrode moves to its proximal position, i.e., near but not touching the substrate. At step 720 gas is supplied to the chamber and at step 725 RF is provided to the electrode to ignite and maintain the plasma. Note that if another arrangement is used to ignite the plasma, e.g., inductive coils, remote microwave, etc., the RF to the electrode is still needed in order to provide the bias potential to accelerate plasma species towards the substrate. The gas and RF are supplied as long as processing proceeds and, when process it terminated at step 730, RF is terminated at 735, gas delivery is terminated at 740, and then the electrode is moved to its distal position, i.e., away from the substrate. The process may then be repeated to process the next disk and move the current disk to another chamber.

Figure 15:
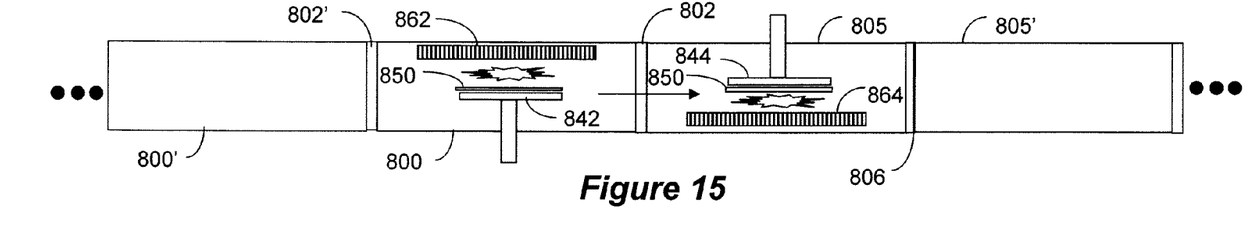
FIG. 15 illustrates an alternative embodiment of the system according to the invention.

FIG. 15 illustrates an alternative embodiment of the system according to the invention. In FIG. 15, the two etching chambers 800 and 805 are coupled without any cooling chamber in between them. Rather, a cooling chamber 800' and 805' is provided between each doublets of etch chambers, so that the substrate undergoes etching on both sides before it enters a cooling chamber.

Figure 16:
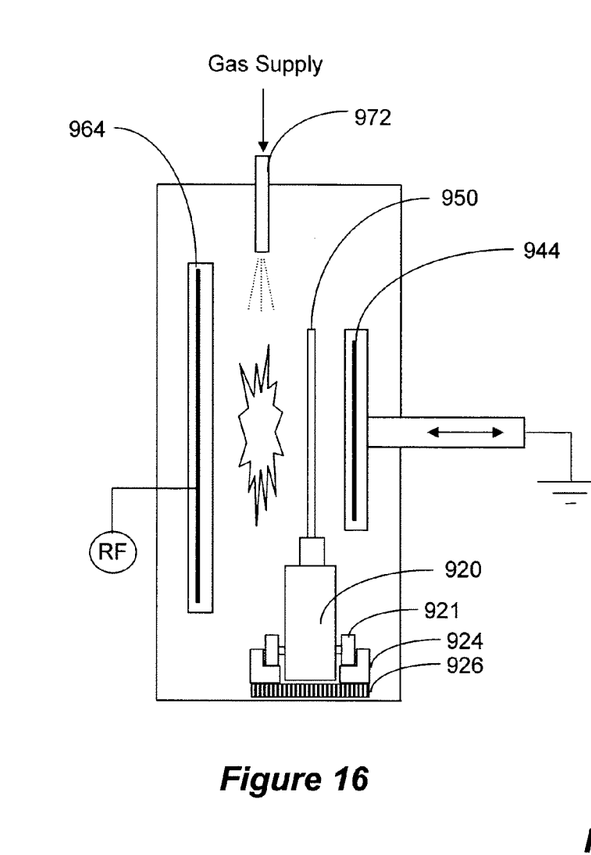
FIG. 16 illustrates certain alternative features according to embodiments of the invention.

FIG. 16 illustrates certain alternative features according to embodiments of the invention. For illustration purposes, the chamber of FIG. 16 is similar to that of FIG. 10, highlighting the following differences. For example, in the chamber of FIG. 16 one or more gas injectors 972 are provided, rather than using a showerhead. Conversely, the chamber may employ both a showerhead and gas injectors. For example, the showerhead may provide one type of gas, e.g., inactive gas, while the injector provide another type of gas, e.g., reactive gas. Another feature of the chamber of FIG. 16 is the use of a movable anode. That is, in the chamber of FIG. 16, the RF power is coupled to a stationary electrode 964, which may or may not be embedded in a showerhead. A movable anode 944 is coupled to ground.

Figure 17:
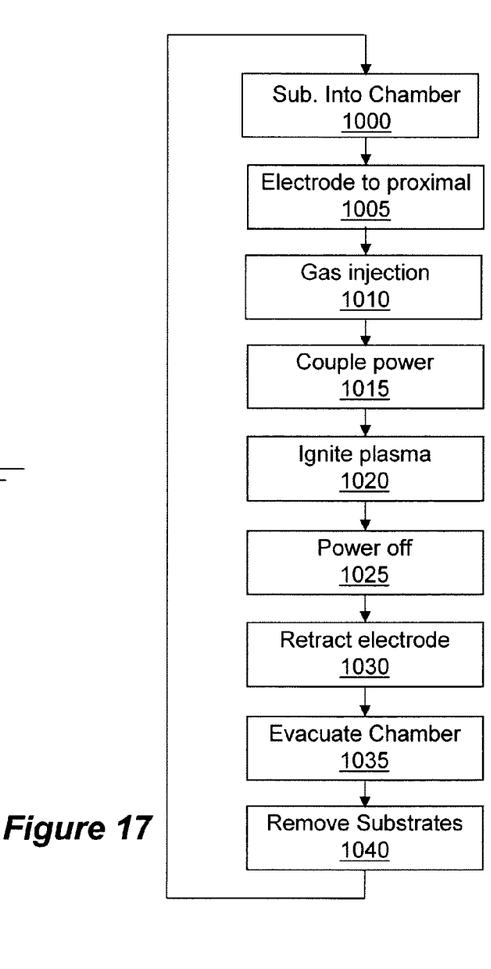
FIG. 17 is a flow chart illustrating an etch process according to an embodiment of the invention.

FIG. 17 is a flow chart illustrating a process according to an embodiment of the invention. The process of FIG. 17 may be utilized with any of the chambers structured according to the subject invention. In step 1000, a substrate is moved into the chamber. In step 1005 the movable electrode is moved to a position proximal to, but not touching, the substrate. In step 1010 gas is introduced into the chamber and in step 1015 power is coupled to either the movable or stationary electrodes, so that in step 1020 plasma is ignited. In this condition the substrate is processed by, e.g., physical and/or reactive ion etching. When processing step is completed, either by timing or by detecting an end-point, the RF power is turned off in step 1025, the electrode is retracted to its distal position in step 1030, and the chamber is evacuated in step 1035. In step 1040 the substrate is removed and the process repeats itself for another substrate. It should be noted that while removing one substrate and introducing another substrate is shown as two separate steps, these can be done concurrently, i.e., as one substrate moves out the second one may be moved in.

Alternative Non-Etch Processes and System Architectures

Figure 18:
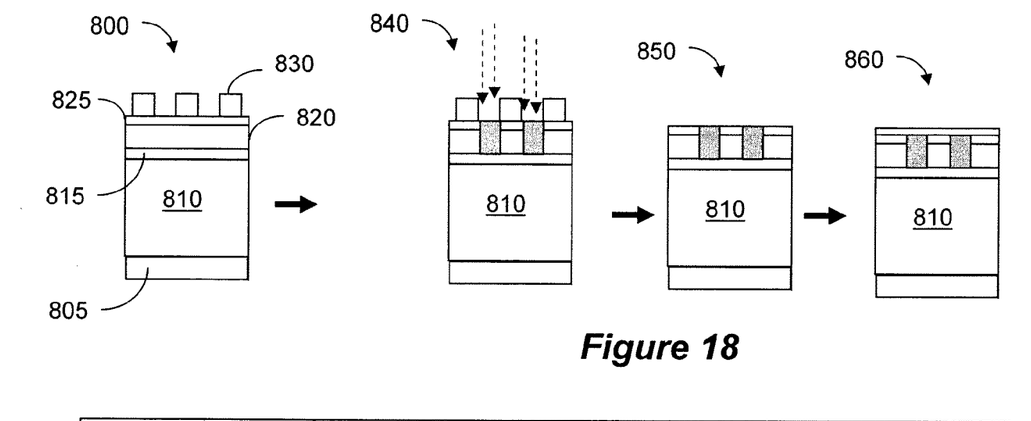
FIG. 18 illustrates another process for fabricating a patterned media disk according to an embodiment of the invention.
Figure 19:
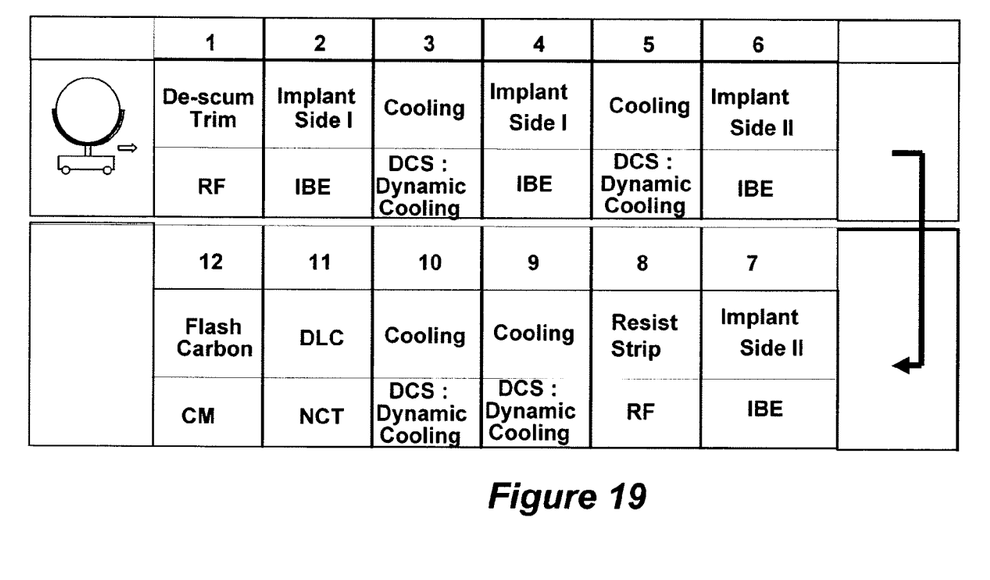
FIG. 19 illustrates a general architecture of a system tailored for executing the process of FIG. 18.

FIG. 18 illustrates a non-etch process for fabricating a patterned media disk according to an embodiment of the invention. FIG. 19 illustrates a general architecture of a system tailored for executing the process of FIG. 18. In this example ion implantation is used to define the patterns of the magnetic layer. Following de-scum/strip process in chamber 1, ion implementation is performed at step 840. As shown in FIG. 19, in this example the ion implantation process is performed one side at a time, with cooling in between. The implementation may be of, e.g., He, N or Ar ions that would disturb the magnetic layer so as to define pattern therein. When implantation is completed, at step 850 the photo-resist is stripped (chamber 8). Then, a protective layer is formed at step 860 (chamber 11 and 12).

Alternative Patterning-First Processes and System Architectures

Figure 20:
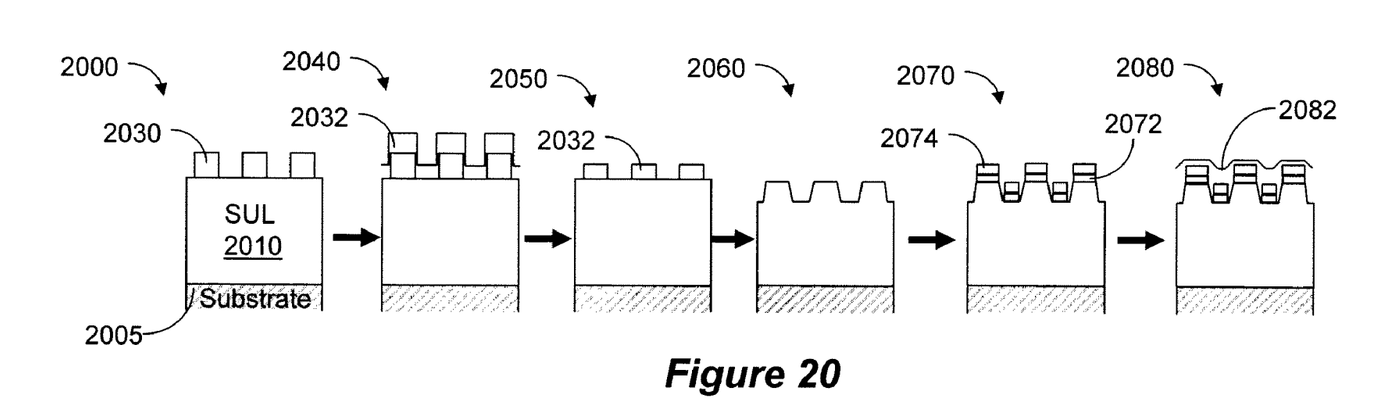
FIG. 20 illustrates an example for patterning-first process according to an embodiment of the invention.

FIG. 20 illustrates an example for patterning-first process according to an embodiment of the invention. The process of FIG. 20 starts by patterning a photoresist 2030 over the SUL layer 2010 which was formed on substrate 2005. This structure is then moved into a system configured according to embodiments of the invention, using any of the examples disclosed herein. At step 2040 a hard mask 2032 is formed over the patterned photo-resist. In step 2050 the photo-resist is removed so as to leave only pattern formed by the hard mask 2032. In step 2060 the SUL layer is etched using the hard mask for patterning. This step may be performed by sequentially etching each side of the disk, as described above. The hard mask may then be removed (not shown) and then a seed layer 2072 and magnetic layer 2074 are formed over the etched pattern in step 2070, which is then capped with carbon deposition/etch back and a protective layer 2082 in step 2080.

Figure 21:
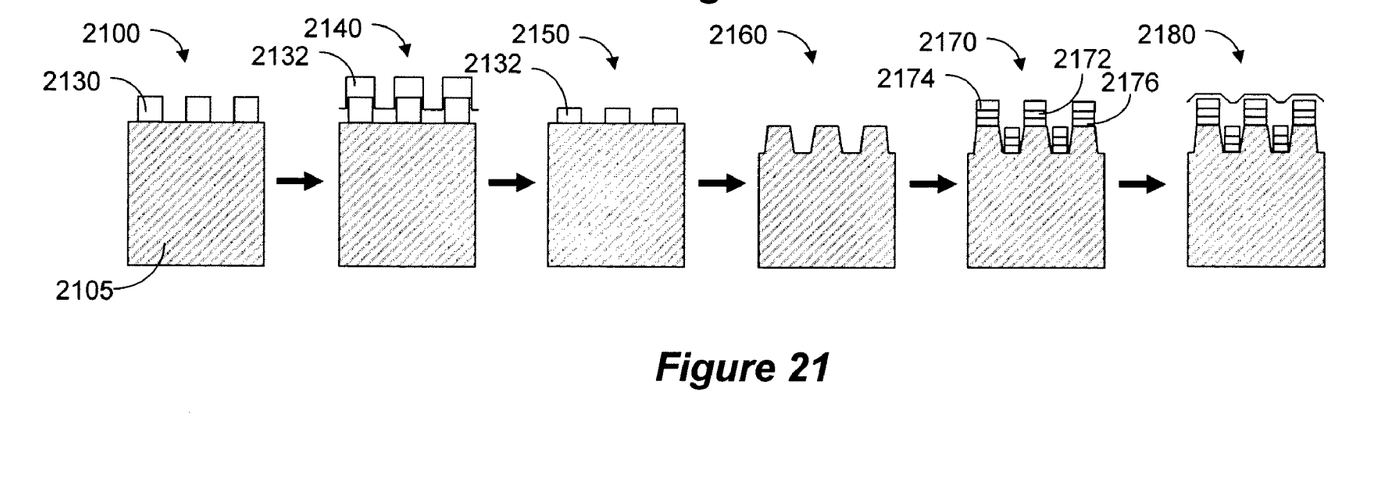
FIG. 21 illustrates another example for patterning-first process according to an embodiment of the invention.

FIG. 21 illustrates another example for patterning-first process according to an embodiment of the invention. The process of FIG. 21 starts by patterning a photo-resist 2030 directly over substrate 2005. This structure is then moved into a system configured according to embodiments of the invention, using any of the examples disclosed herein. At step 2140 a hard mask 2132 is formed over the patterned photo-resist. In step 2150 the photo-resist is removed so as to leave only pattern formed by the hard mask 2132. In step 2160 the substrate 2105 is etched using the hard mask 2132 for patterning. This step may be performed by sequentially etching each side of the disk, as described above. The hard mask may then be removed (not shown) and then a SUL layer 2176, a seed layer 2172 and magnetic layer 2174 are formed over the etched pattern in step 2070, which is then capped with a carbon deposition/etch back and a protective layer 2182 in step 2180.

It should be appreciated that the processes and systems described herein enable commercial fabrication of patterned media disks for hard drives. Fast production and high yield are enabled by the system wherein after the formation of the photo-resist pattern the disk in moved into vacuum environment in the system and the entire patterning fabrication is performed without removing the disk from the vacuum environment.

It should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein. The present invention has been described in relation to particular examples, which are intended in all respects to be illustrative rather than restrictive. Those skilled in the art will appreciate that many different combinations of hardware, software, and firmware will be suitable for practicing the present invention. Moreover, other implementations of the invention will be apparent to those skilled in the art from consideration of the specification and practice of the invention disclosed herein. Various aspects and/or components of the described embodiments may be used singly or in any combination in the server arts. It is intended that the specification and examples be considered as exemplary only, with a true scope and spirit of the invention being indicated by the following claims.

The invention claimed is:

1. A method for producing patterned media hard disk, comprising:
   forming a magnetic stack over a disk substrate;
   depositing photoresist over the magnetic stack;
   patterning the photoresist;
   transferring the disk into a vacuum environment inside a fabrication system and, without removing the disk from the vacuum environment performing the steps:
      etching the magnetic stack;
      forming refill layer over the etched magnetic stack;
      etching back the refill layer; and,
      forming a protective layer over the refill layer;
   wherein the steps are performed without removing the disk from the vacuum environment; and,
   wherein etching of the magnetic stack is performed on one side of the disk at a time, to thereby etch both sides of the disk, and wherein the steps in the vacuum environment further comprise cooling the disk.

2. The method of claim 1, wherein cooling the disk is performed after etching each side of the disk.

3. The method of claim 1, wherein the magnetic stack comprises a carbon overcoat (COC) layer and a magnetic layer, and wherein etching the magnetic stack comprises etching the COC layer to form a hard mask and using the COC to etch the magnetic layer.

4. The method of claim 3, wherein etching back further comprises removing any residual photoresist or hard mask.

5. A method for producing patterned media hard disk, comprising:
   forming a magnetic stack over a disk substrate;
   depositing photoresist over the magnetic stack;
   patterning the photoresist;
   transferring the disk into a vacuum environment inside a fabrication system and, performing the steps:
      etching the magnetic stack;
      forming refill layer over the etched magnetic stack;
      etching back the refill layer; and,
      forming a protective layer over the refill layer; and,
   further comprising forming a hard mask over the photoresist prior to etching the magnetic stack.

6. The method of claim 5, wherein etching back further comprises removing any residual hard mask.

7. The method of claim 5, further comprising a step of photoresist stripping after the step of forming a hard mask and before the step of etching the magnetic stack.

8. The method of claim 7, wherein the steps of forming hard mask, photoresist strip, and etching the magnetic stack are performed without removing the disk from the vacuum environment.

9. A method for producing patterned media hard disk, comprising:
   depositing photoresist over the disk;
   patterning the photoresist to form a mask;
   transferring the disk into a vacuum environment inside a fabrication system and, without removing the disk from the vacuum environment performing the steps:
      etching the disk through the mask;
      forming refill layer over the etched disk;
      etching back the refill layer; and,
      forming a protective layer over the refill layer; and,
   wherein the steps are performed without removing the disk from the vacuum environment; and,
   wherein etching of the magnetic stack is performed on one side of the disk at a time, to thereby etch both sides of the disk, and wherein the steps in the vacuum environment further comprise cooling the disk.

10. The method of claim 9, wherein depositing photoresist over the disk comprises depositing the photoresist directly over the disk substrate and further comprising the steps of forming soft underlayer, seed layer, and magnetic layer, after the step of etching the disk.

11. The method of claim 10, further comprising forming a hard mask over the photoresist prior to etching the disk.

12. A method for producing patterned media hard disk, comprising:
   depositing photoresist over the disk;
   patterning the photoresist to form a mask;

transferring the disk into a vacuum environment inside a fabrication system and, without removing the disk from the vacuum environment performing the steps:

etching the disk through the mask;
  forming refill layer over the etched disk;
  etching back the refill layer; and,
  forming a protective layer over the refill layer; and, wherein depositing photoresist over the disk comprises depositing the photoresist directly over a soft underlayer (SUL), and further comprising the steps of forming seed layer and magnetic layer after the step of etching the disk.

13. The method of claim 12, further comprising forming a hard mask over the photoresist prior to etching the disk.

14. The method of claim 12, wherein etching of the disk is performed on one side of the disk at a time, and wherein the steps in the vacuum environment further comprise cooling the disk.

* * * * *